United States Patent [19]

Ishiguro et al.

[11] 4,093,962
[45] June 6, 1978

[54] ADAPTIVE PREDICTIVE ENCODER

[75] Inventors: Tatsuo Ishiguro; Norio Suzuki, both of Tokyo, Japan

[73] Assignee: Nippon Electric Co., Ltd., Tokyo, Japan

[21] Appl. No.: 746,558

[22] Filed: Dec. 1, 1976

[51] Int. Cl.² ............................................. H04N 7/12
[52] U.S. Cl. .................................... 358/138; 358/135; 325/38 B
[58] Field of Search ................. 358/135, 260, 261, 13, 358/138; 325/38 B

[56] References Cited

U.S. PATENT DOCUMENTS

| | | | |
|---|---|---|---|
| 3,403,226 | 9/1968 | Wintringham | 358/135 |
| 3,422,227 | 1/1969 | Brown | 358/135 |
| 3,439,753 | 4/1969 | Mounts | 358/135 |
| 3,984,626 | 10/1976 | Mounts | 358/135 |
| 4,023,199 | 5/1977 | Netravali | 358/135 |

Primary Examiner—Howard W. Britton
Attorney, Agent, or Firm—Sughrue, Rothwell, Mion, Zinn and Macpeak

[57] ABSTRACT

In a predictive encoder, a predictive error signal is multiplied in effect by a controllable factor before quantized into information codes. A variable length coder converts the information codes into variable length codes, which are temporarily stored in a buffer memory for transmission to a receiver at a predetermined bit rate. The controllable factor is controlled by buffer occupancy of the buffer memory. Normally, the factor may be ½. The factor is decreased when the buffer occupancy increases towards overflow.

3 Claims, 3 Drawing Figures

ADAPTIVE PREDICTIVE ENCODER

BACKGROUND OF THE INVENTION

This invention relates to an adaptive predictive encoder for use in a predictive code communication system.

A predictive code communication system is suitable in effectively transmitting and receiving highly redundant signals, such as a television signal. A typical one is a differential pulse code modulation system (DPCM). According to simplest differential pulse code modulation of a signal, a difference (called a predictive error signal) between a present or current sample of the signal and a predicted value therefor is encoded to produce an information code with the predicted value being given by decoding another information code produced for a next previous sample. This system is very effective when applied to a television signal. The predictive error signal, however, has an amplitude distribution concentrated in a small amplitude region so that the information codes for smaller quantization levels appear more frequently to result in another redundancy. It is therefore possible to further raise the efficiency of encoding by adopting variable length codes with an information code of a shorter duration assigned to more frequently occurring quantization levels.

For differential pulse code modulation of a television signal, variable length codes make it possible to decrease the amount of information by one bit per sample on the average as compared with equal length codes. In practice, the decrease varies from zero to about two bits depending on the nature of the signal. A buffer memory is therefore used to temporarily store the variable length codes before transmitting them at a predetermined transmission or bit rate. Overflow of the buffer memory is nevertheless inevitable for a signal portion carrying much information, namely, for rapidly varying information, when use is made of a transmission rate suitable to an average amount of the information.

In order to avoid the overflow, proposals have been made to somehow change the quantization characteristics when the buffer occupancy tends to increase beyond a certain threshold value. For example, the quantization levels may be restricted either to prohibit production of longer codes or to switch the longer codes to equal length codes. The restriction imposed on the number of quantization levels, however, undesiredly strengthen the overload distortion to degrade the encoding performance. On encoding a television signal, this leads to ambiguous outlines of pictures or production of the so-called edge business. Alternatively, the quantization characteristics may be changed by widening the amplitude range of the samples for the smallest quantization level, such as the zero quantization level, so as to make shorter codes appear more frequently. A wider quantization level for small amplitude samples, however, results in a greater quantization error.

SUMMARY OF THE INVENTION

It is therefore an object of the present invention to provide a predictive encoder whereby an input signal is encoded into variable length codes with a rate of production of the codes adaptively restricted for rapidly varying information.

It is another object of this invention to provide a predictive encoder of the type described, of which encoding performance is hardly adversely affected even when the rate of production of the codes is restricted for rapidly varying information.

In the manner known in the art, a predictive encoder comprises means responsive to an input signal for producing a predictive error signal, a quantizer responsive to the predictive error signal for producing information codes, means for converting the information codes into variable length codes, and a buffer memory for temporarily storing the variable length codes for transmission at a predetermined bit rate. One of the prior art encoders further comprises means operatively coupled to the buffer memory for producing a buffer status signal indicative of buffer occupancy of the buffer memory. In accordance with this invention, the encoder still further comprises control means operatively coupled to the quantizer for varying in response to the buffer status signal the amplitude of the predictive error signal relative to quantization levels of the quantizer.

DESCRIPTION OF THE PREFERRED EMBODIMENTS

Figure 1:
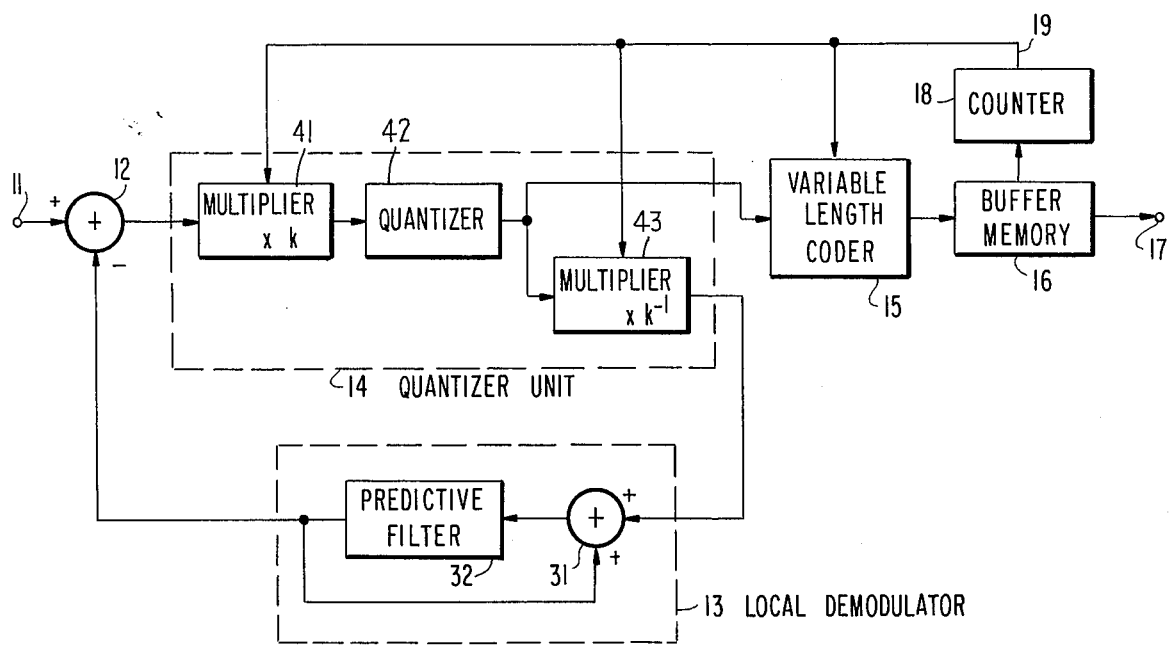
FIG. 1 is a block diagram of an adaptive predictive encoder according to a first embodiment of the present invention.

Referring to FIG. 1, a predictive encoder comprises an input terminal 11 to which an input signal is supplied to be encoded by the encoder. A subtractor 12 subtracts a local output signal of a local demodulator 13 from the input signal to produce a predictive error signal, which is subsequently quantized by a quantizer unit 14. The demodulator 13 comprises an adder 31 for calculating a sum of the quantized predictive error signal and the local demodulator output signal, and a predictive filter 32 supplied with the adder output signal to produce the demodulator output signal as a locally generated sample predictive of a sample of the input signal at the next succeeding sampling instant.

Referring more specifically to FIG. 1, the quantizer unit 14 comprises in accordance with a first embodiment of the present invention a first multiplier 41 for multiplying the predictive error signal by a factor $k$ to produce a controlled predictive error signal, a logic circuit or quantizer 42 for quantizing the controlled predictive error signal successively into information codes, and a second multiplier 43 for multiplying the information codes by the inverse number $k^{-1}$ of the factor $k$ to produce the above-mentioned quantized predictive error signal. As will be described later, the factor $k$ may be equal to $\frac{1}{2}$ during normal operation of the encoder. When the predictive error signal is a binary signal as is usually the case, the first multiplier 41 may shift the predictive error signal by one bit towards the less significant digits to multiply the same by $\frac{1}{2}$. The quantizer 42 may be a read-only memory responsive to the predictive error signal supplied thereto as an address signal for producing the information codes. The information codes are of equal length in general and are supplied to a variable length coder 15 for converting the same into variable length codes, which are temporarily stored in a buffer memory 16 and supplied to an output terminal 17 at a predetermined bit rate to be transmitted to a receiver (not shown).

As described in U.S. patent application Ser. No. 657,799 now U.S. Pat. No. 4,027,100 filed Feb. 13, 1976, by Tatsuo ISHIGURO, one of the present applicants, the buffer memory 16 is accompanied by a device or counter 18 for producing a buffer occupancy or status signal indicative of buffer occupancy of the buffer memory 16. The buffer status signal is supplied to the multipliers 41 and 43 through a connection 19 to control the factor $k$. The buffer status signal may be produced by sampling the buffer occupancy once every field interval or once each fraction of the field interval. It should be noted here that the buffer memory 16 has a sufficient capacity or size. For example, let it be desired to achieve a balance for each field of a television signal between the number of bits read into the buffer memory 16 and those read out thereof. For a sampling frequency of 10.8 MHz and an average code length of three bits, the buffer occupancy increases by about 180 kilobits during one field interval when an increase of one bit per sample occurs on the average. The buffer memory 16 should have a capacity of about 200 to 300 kilobits under the circumstances. It is now understood in conjunction with the first embodiment of this invention that a predictive error signal is multiplied by the controllable factor $k$ to become a controlled predictive error signal before the quantization and that the controlled and quantized predictive error signal is inversely multiplied by the controllable factor $k$ before the demodulation. The multiplication by a factor $k$ is equivalent to an increase of about $\log_2 k$ bits/sample in the entropy of the information. When the factor $k$ is equal to $\frac{1}{2}$ as mentioned hereinabove, the entropy decreases by about one bit per sample.

Figure 2:
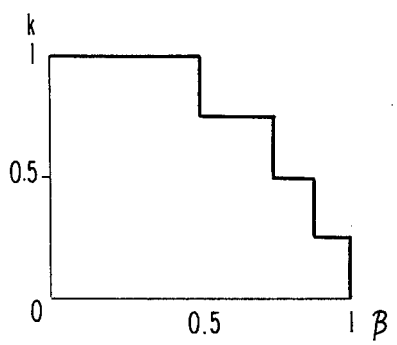
FIG. 2 shows an example of a stepwise controlled factor used in putting an adaptive predictive encoder according to this invention into operation.

Referring to FIG. 2, an example of the control for the controllable factor $k$ is illustrated versus a normalized buffer occupancy B. The factor $k$ is set at $\frac{1}{2}$ for normal operation of the encoder and is stepwise decreased when the normalized buffer occupancy B increases towards unity.

Figure 3:
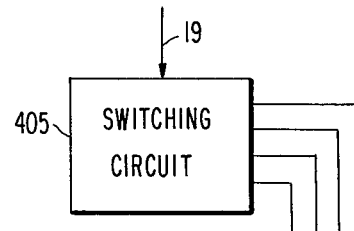
FIG. 3 is a partial block diagram of an adaptive predictive encoder according to a second embodiment of this invention.

Finally referring to FIG. 3, a quantizer unit 14 comprises in accordance with a second embodiment of this invention first through fourth read-only memories 401, 402, 403, and 404 having different quantization levels, and a logic or switching circuit 405 responsive to the buffer status signal for selectively supplying the predictive error signal from the subtractor 12 to a selected one of the read-only memories 401-404. It is now possible with the illustrated arrangement of the quantizer unit 14 to equivalently change the above-mentioned controllable factor $k$.

With any of the embodiments thus far described, it is possible to transmit the buffer status signal to a receiver of the predictive code communication system either by adding the same as a mode signal to each of the frame synchronizing signals interspersed at the variable length coder 15 in the variable length codes or by adding the same to pertinent ones of the horizontal synchronizing signals. At any rate, a predictive encoder according to this invention makes it possible to control the amount of information by practically continuously reducing the controllable factor $k$ when the buffer occupancy unduly increases. The restriction imposed on the number of quantization levels is thereby removed in practice to get rid of the deterioration otherwise resulting in the encoding performance from the overload distortion. When the controllable factor $k$ is changed, a variation occurs in the relation between the amplitude of the controlled predictive error signal and the quantization levels of the quantizer 42 or the quantizers 401-404. This may result in a slight change in the quantization error but little adversely affects the encoding performance. If the buffer memory 16 is still liable to overflow or underflow, the encoding performance may further be controlled in any of the conventional manners. For example, the variable length coder 15 may be controlled by the buffer status signal upon occurrence of the underflow to transmit the equal length information codes without converting them into shorter variable length codes. Upon occurrence of the overflow, the variable length coder 15 may be controlled to convert the codes supplied from the quantizer 14 or quantizers 401-404 to equal length codes of a shorter duration so as to reduce the number of bits to be read into the buffer memory 16.

What is claimed is:

1. In a predictive encoder having means responsive to an input signal for producing a predictive error signal, quantizer means responsive to said predictive error signal for producing information codes, means for converting said information codes into variable length codes, a buffer memory for temporarily storing said variable length codes for transmission at a predetermined bit rate, and means operatively coupled to said buffer memory for producing a buffer status signal indicative of buffer occupancy of said buffer memory, wherein the improvement comprises: said quantizer means comprising control means for varying in response to said buffer status signal the amplitude of said predictive error signal relative to quantization levels of said quantizer means.

2. A predictive encoder as claimed in claim 1, wherein said quantizer means includes a quantizer responsive to a quantizer input signal for producing said information codes, and control means comprises means for multiplying in effect said predictive error signal by a controllable factor to produce a controlled predictive error signal, means for supplying said controlled predictive error signal to said quantizer as said quantizer input signal, and means for controlling said controllable factor in response to said buffer status signal.

3. A predictive encoder as claimed in claim 1, wherein said quantizer means comprises a plurality of quantizers responsive to quantizer input signals, respectively, for producing said information codes with different quantization levels, wherein said control means comprises means responsive to said buffer status signal for supplying said predictive error signal to a selected one of said quantizers.

* * * * *